United States Patent
You et al.

[11] Patent Number: 6,147,000
[45] Date of Patent: Nov. 14, 2000

[54] METHOD FOR FORMING LOW DIELECTRIC PASSIVATION OF COPPER INTERCONNECTS

[75] Inventors: Lu You, Santa Clara; Shekhar Pramanick, Fremont; Takeshi Nogami, Sunnyvale, all of Calif.

[73] Assignee: Advanced Micro Devices, Inc., Sunnyvale, Calif.

[21] Appl. No.: 09/225,546

[22] Filed: Jan. 5, 1999

Related U.S. Application Data

[63] Continuation-in-part of application No. 09/132,282, Aug. 11, 1998.

[51] Int. Cl.[7] .................. H01L 21/44; H01L 21/4763
[52] U.S. Cl. .................. 438/687; 438/626; 438/629; 438/645; 438/660; 438/661
[58] Field of Search ................... 438/687, 660, 438/641, 662, 663, 635, 625, 626, 627, 628, 629, 642, 643, 644, 648, 645, 685

[56] References Cited

U.S. PATENT DOCUMENTS

| | | | |
|---|---|---|---|
| 5,447,599 | 9/1995 | Li et al. .................... | 216/17 |
| 5,483,105 | 1/1996 | Kaja et al. ................. | 257/779 |
| 5,539,256 | 7/1996 | Mikagi ...................... | 257/763 |
| 5,598,027 | 1/1997 | Matsuura .................... | 257/635 |
| 5,693,563 | 12/1997 | Teong ...................... | 438/627 |
| 5,739,579 | 4/1998 | Chiang et al. .............. | 257/635 |
| 5,818,110 | 10/1998 | Cronin ..................... | 257/775 |
| 5,891,513 | 4/1999 | Dubin et al. ............... | 427/98 |
| 5,969,422 | 10/1999 | Ting et al. ................ | 257/762 |
| 5,976,710 | 10/1999 | Sachdev et al. ............. | 428/623 |
| 6,022,808 | 2/2000 | Nagami et al. .............. | 438/694 |

*Primary Examiner*—Tuan H. Nguyen
*Assistant Examiner*—Thanhha Pham

[57] ABSTRACT

A Cu interconnect member is passivated by diffusing Sn, Ta or Cr atoms into its upper surface to form an intermetallic layer. Embodiments include depositing Cu by electroplating or electroless plating to fill a damascene opening in a dielectric layer, CMP, depositing a sacrificial layer of Sn, Ta or Cr on the planarized surface, heating to diffuse Sn, Ta or Cr into the upper surface of the deposited Cu to form a passivating intermetallic alloy layer, and removing any remaining sacrificial layer by CMP or etching.

21 Claims, 4 Drawing Sheets

METHOD FOR FORMING LOW DIELECTRIC PASSIVATION OF COPPER INTERCONNECTS

RELATED APPLICATION

This application is a continuation-in-part application of copending application Ser. No. 09/132,282 filed Aug. 11, 1998, the entire disclosure of which is incorporated herein by reference.

TECHNICAL FIELD

The present invention relates to semiconductor devices comprising copper (Cu) interconnection patterns. The present invention is applicable to manufacturing high speed integrated circuits having submicron design features and high conductivity interconnect structures.

BACKGROUND ART

The escalating requirements for high density and performance associated with ultra large scale integration semiconductor wiring require responsive changes in interconnection technology. Such escalating requirements have been found difficult to satisfy in terms of providing a low RC (resistance capacitance) interconnection pattern, particularly wherein submicron vias, contacts and trenches have high aspect ratios imposed by miniaturization.

Conventional semiconductor devices comprise a semiconductor substrate, typically doped monocrystalline silicon, and a plurality of sequentially formed dielectric interlayers and conductive patterns. An integrated circuit is formed containing a plurality of conductive patterns comprising conductive lines separated by interwiring spacings, and a plurality of interconnect lines, such as bus lines, bit lines, word lines and logic interconnect lines. Typically, the conductive patterns on different layers, i.e., upper and lower layers, are electrically connected by a conductive plug filling a via hole, while a conductive plug filling a contact hole establishes electrical contact with an active region on a semiconductor substrate, such as a source/drain region. Conductive lines formed in trenches typically extend substantially horizontal with respect to the semiconductor substrate. Semiconductor "chips" comprising five or more levels of metallization are becoming more prevalent as device geometries shrink to submicron levels.

A conductive plug filling a via hole is typically formed by depositing a dielectric interlayer on a conductive layer comprising at least one conductive pattern, forming an opening through the dielectric interlayer by conventional photolithographic and etching techniques, and filling the opening with a conductive material, such as tungsten (W). Excess conductive material on the surface of the dielectric interlayer is typically removed by chemical mechanical polishing (CMP). One such method is known as damascene and basically involves forming an opening in the dielectric interlayer and filling the opening with a metal. Dual damascene techniques involve forming an opening comprising a lower contact or via hole section in communication with an upper trench section, which opening is filled with a conductive material, typically a metal, to simultaneously form a conductive plug in electrical contact with a conductive line.

High performance microprocessor applications require rapid speed of semiconductor circuitry. The control speed of semiconductor circuitry varies inversely with the resistance and capacitance of the interconnection pattern. As integrated circuits become more complex and feature sizes and spacings become smaller, the integrated circuit speed becomes less dependent upon the transistor itself and more dependent upon the interconnection pattern. Miniaturization demands long interconnects having small contacts and small cross-sections. As the length of metal interconnects increases and cross-sectional areas and distances between interconnects decrease, the RC delay caused by the interconnect wiring increases. If the interconnection node is routed over a considerable distance, e.g., hundreds of microns or more as in submicron technologies, the interconnection capacitance limits the circuit node capacitance loading and, hence, the circuit speed. As design rules are reduced to about 0.18μ and below, the rejection rate due to integrated circuit speed delays severely limits production throughput and significantly increases manufacturing costs. Moreover, as line widths decrease, electrical conductivity and electromigration resistance become increasingly important.

Cu has received considerable attention as a candidate for replacing Al in VLSI interconnect metallizations. Cu is relatively inexpensive, easy to process and has a lower resistivity than Al. In addition, Cu has improved electrical properties vis-à-vis W, making Cu a desirable metal for use as a conductive plug as well as conductive wiring.

Electroless plating and electroplating of Cu and Cu alloys offer the prospect of low cost, high throughput, high quality plated films and efficient via, contact and trench filling capabilities. Electroless plating generally involves the controlled autocatalytic deposition of a continuous film on the catalytic surface by the interaction in solution of a metal salt and a chemical reducing agent. Electroplating comprises the electrodeposition of an adherent metallic coating on an electrode employing externally supplied electrons to reduce metal ions in the plating solution. A seed layer is required to catalyze electroless deposition or to carry electrical current for electroplating. For electroplating, the seed layer must be continuous. For electroless plating, very thin catalytic layers, e.g., less than 100 Å, can be employed in the form of islets of catalytic metal.

An approach to forming Cu plugs and wiring comprises the use of damascene structures employing CMP, as in Teong, U.S. Pat. No. 5,693,563. However, due to Cu diffusion through dielectric interlayer materials, such as silicon dioxide, Cu interconnect structures must be encapsulated by a diffusion barrier layer. Typical diffusion barrier metals include tantalum (Ta), tantalum nitride (TaN), titanium (Ti), titanium nitride (TiN), titanium-tungsten (TiW), tungsten (W), tungsten nitride (WN), Ti—TiN, titanium silicon nitride (TiSiN), tungsten silicon nitride (WSiN), tantalum silicon nitride (TaSiN) and silicon nitride for encapsulating Cu. The use of such barrier materials to encapsulate Cu is not limited to the interface between Cu and the dielectric interlayer, but includes interfaces with other metals as well.

There are additional significant problems attendant upon conventional Cu interconnect methodology employing a diffusion barrier layer (or capping layer). For example, conventional practices comprise forming a damascene opening in an interdielectric layer, depositing a barrier layer such as Ta or TaN, filling the opening with Cu, CMP, and forming a capping layer on the exposed Cu surface. It was found, however, that capping layers, such as silicon nitride, exhibit poor adhesion to Cu. Consequently, the capping layer is vulnerable to removal, as by peeling due to scratching or stresses resulting from subsequent deposition of layers. As a result, the Cu interconnect is not entirely encapsulated and Cu diffusion occurs, thereby adversely affecting device performance and decreasing the electromigration resistance of the Cu interconnect member. Moreover, the conventional silicon nitride capping layer exhibits a relatively high dielectric constant of about 8.

As design rules extend deeper into the submicron range, e.g., about $0.18\mu$ and under, the reliability of the interconnection pattern becomes particularly critical. Accordingly, the adhesion of capping layers to Cu interconnects requires even greater reliability.

There exists a need for methodology enabling the formation of passivated Cu interconnect members having high reliability. There exists a particular need for methodology for passivating Cu interconnect members without increasing the RC of the Cu interconnect members.

DISCLOSURE OF THE INVENTION

An advantage of the present invention is a method of manufacturing a semiconductor device having highly reliable Cu interconnect members.

Another advantage of the present invention is a method of manufacturing a semiconductor device comprising a highly reliable passivated Cu interconnect member without increasing the RC of the Cu interconnect member.

Another advantage of the present invention is a semiconductor device comprising a highly reliable passivated Cu interconnect member with a low RC.

Additional advantages and other features of the present invention will be set forth in the description which follows, and in part will become apparent to those having ordinary skill in the art upon examination of the following or may be learned from the practice of the present invention. The advantages of the present invention may be realized and obtained as particularly pointed out in the appended claims.

According to the present invention, the foregoing and other advantages are achieved in part by a method of manufacturing a semiconductor device, the method comprising: forming a Cu layer; chemical-mechanical polishing; forming a sacrificial layer, comprising tin (Sn), tantalum (Ta), chromium (Cr) or an alloy thereof, on a surface of the Cu layer; and heating to diffuse Sn, Ta and/or Cr into the upper surface of the Cu layer to form a passivating surface layer comprising Cu and Sn, Ta and/or Cr.

Embodiments include depositing a sacrificial layer containing Sn, Ta and/or Cr, on a planarized Cu surface, such as a Cu plug filling a damascene opening, and heating to cause diffusion of Sn, Ta, or Cr from the sacrificial layer into the upper surface of the Cu interconnect, thereby forming an electrically conductive passivating intermetallic alloy layer or region at the upper surface of the Cu interconnect member.

Another aspect of the present invention a semiconductor device comprising: a layer of Cu having an upper surface comprising a passivation layer containing Cu and Sn, Ta and/or Cr.

Additional advantages of the present invention will become readily apparent to those skilled in this art from the following detailed description, wherein embodiments of the present invention are described, simply by way of illustration of the best mode contemplated for carrying out the present invention. As will be realized, the present invention is capable of other and different embodiments, and its several details are capable of modifications in various obvious respects, all without departing from the present invention. Accordingly, the drawings and description are to be regarded as illustrative in nature, and not as restrictive.

BRIEF DESCRIPTION OF DRAWINGS

FIGS. 1–5 are enlarged cross-sectional views of an integrated circuit wafer showing the formation of a protective layer where a thin copper oxide layer was present after CMP;

FIGS. 6 and 7 are enlarged cross-sectional views of an integrated circuit wafer showing an alternative process for forming a protective layer where a thick copper oxide layer was present after CMP; and FIG. 8 is a process flow chart showing steps in the process of fabricating an integrated circuit.

DESCRIPTION OF THE INVENTION

The present invention addresses and solves problems attendant upon capping a Cu interconnect member, as with a capping layer of silicon nitride. The present invention also enables the formation of reliable passivated Cu interconnect members without the need to resort to silicon nitride as a capping layer with its poor adhesion to Cu and high dielectric constant. Thus, the present invention enables formation of a reliable passivated Cu interconnect member with a low RC in an efficient, cost effective manner.

Figure 1:
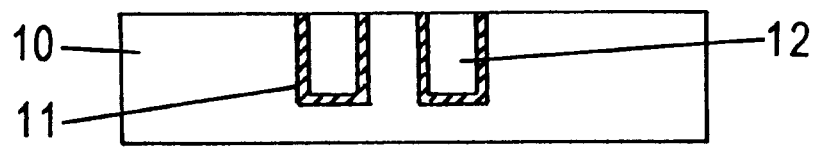
FIGS. 1–8 correspond to FIGS. 1–8 of parent application Ser. No. 09/132,282. Specifically.

In copending parent application Ser. No. 09/132,282, methodology is disclosed for reducing or substantially eliminating a copper oxide layer formed on a Cu interconnect. The copper oxide alloy layer, which undesirably forms on the Cu interconnect subsequent to CMP and prevents adhesion of a capping layer thereto, is eliminated or substantially reduced by forming a protective intermetallic layer on the Cu interconnect. Referring to FIG. 1, as disclosed in copending parent application Ser. No. 09/132,282 there is shown an enlarged cross-sectional view of an integrated circuit undergoing fabrication. There is shown a substrate 10, e.g., silicon, on which is provided a dielectric layer, e.g., silicon oxide, which dielectric layer may be relatively thick, e.g., one micrometer. The surface of the silicon oxide layer is then selectively etched to produce open trenches therein. It will be understood that these "trenches" are in reality minuscule linear longitudinal depressions in the surface of the silicon oxide. A barrier layer 11 is then deposited on the silicon oxide surface and the exposed trenches. Barrier layer 11 may be made of a material such as TiN, Ta or TaN, and prevents metal diffusion into the silicon oxide layer.

A conductive metal layer, i.e., Cu, is then deposited on the surface of the barrier layer 11 and filling the trenches to form interconnect lines 12. Excess metal and barrier material are then removed and the surface planarized by CMP, leaving the surface of the damascene Cu interconnect lines 12 exposed. The surface is now ready for deposition of a subsequent layer in the production sequence. This process may be repeated many times during semiconductor fabrication as the semiconductor is built up step by step and layer by layer.

Figure 2:
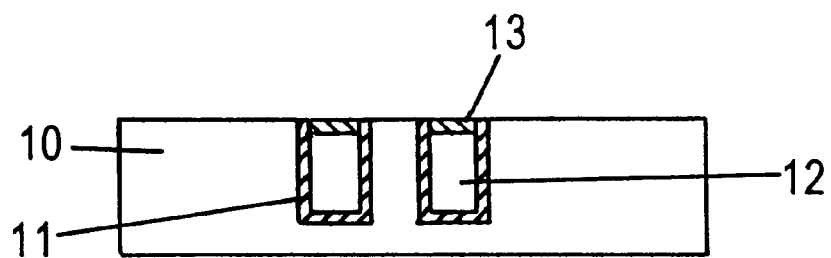

Referring to FIG. 2, there is shown a copper oxide layer 13 on the surface of the damascene Cu interconnect line 12. The copper oxide layer 13 often forms during the production sequence due to reaction of the Cu surface with strong oxidizing slurries used in CMP or exposure on the surface of the Cu interconnect line 12 to an oxidizing atmosphere. The copper oxide layer 13 has deleterious effects on the circuit. The thickness of the copper oxide layer 13 can vary depending upon the CMP process; stronger oxidizing slurries produce thicker copper oxide layers 13.

The invention disclosed in copending parent application Ser. No. 09/132,282 provides methodology for reducing or eliminating copper oxide layer 13 by forming a protective intermetallic layer on the surface of the Cu interconnect line 12. The intermetallic layer is formed by deposition of Ti, which both reduces the copper oxide and forms an intermetallic layer with Cu upon diffusion annealing. When the copper oxide layer 13 is thin, for example, 20–50 Å, the deposited Ti can both reduce the copper oxide layer 13 and form the intermetallic layer. However, when the copper oxide layer 13 is thick, for example, 50–200 Å, often the deposited Ti cannot completely reduce the copper oxide layer 13 during formation of the intermetallic layer. In such a case, it is desirable to first reduce the copper oxide layer 13 before forming the intermetallic Cu—Ti layer. It is to be understood that, depending upon the production sequence and efficiency requirements, it may be preferable to first reduce the copper oxide layer 13 prior to forming the Cu—Ti intermetallic layer without regard to whether the copper oxide layer 13 is thin or thick.

Figure 3:
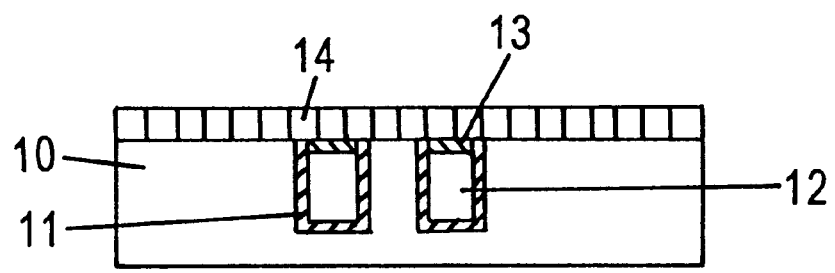

Referring to FIG. 3, there is shown the substrate 10 with a copper oxide layer 13 that is thin, for example, 20–50 Å, resulting from exposure of the Cu surface of the interconnect line 12 to an oxidizing slurry or atmosphere. Ti layer 14, which both reduces copper oxide and forms an intermetallic Cu layer, is deposited on the substrate 10. Deposition can be implemented by sputtering, but other methods of physical vapor deposition or chemical deposition may be employed. Substrate 10 is then annealed to both reduce the copper oxide layer 13 and to form an intermetallic layer of $CuTi_2$. The disclosed preferred method of annealing is in a rapid thermal annealer (RTA) for about 10 to about 60 seconds at about 200° C. to about 450° C. in a nitrogen or argon atmosphere. The RTA provides fast high temperature heating of a wafer. An AST 2800 RTA was employed in practicing the invention, although other annealers that can produce the above temperature and time parameters may be used, if desired. It may also be necessary to employ production capacity annealers that meet the above temperature and time parameters for high volume production.

Figure 4:
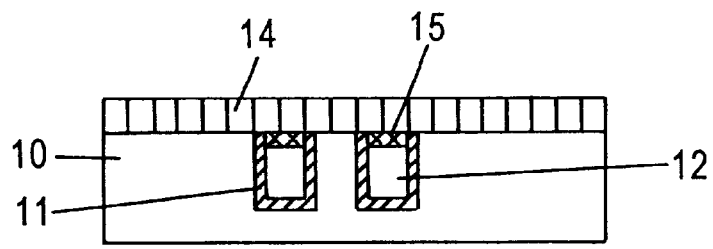

Referring now to FIG. 4, there is shown the formed intermetallic layer 15 of $CuTi_2$ formed during annealing. The process ordinarily results in some unreacted Ti and other Ti by-products. It is next necessary to remove the unreacted Ti and any other Ti by-products, leaving only the intermetallic layer 15 above the damascene interconnect line 12, as by an etching process. The surface of the substrate 10 is selectively etched with an etching solution to remove the excess deposited metal. The etching solution must be selective to the $CuTi_2$ intermetallic layer 15, yet still remove the unreacted Ti and by-products.

Figure 5:
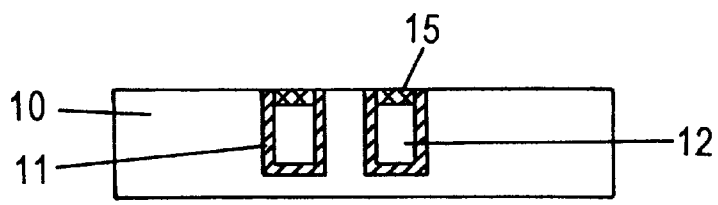

Referring now to FIG. 5, there is shown the substrate 10 after etching with a solution selective to $CuTi_2$, but not to Ti or Ti by-products, leaving the $CuTi_2$ intermetallic layer 15 on the surface of the damascene interconnect line 12. The formation of the $CuTi_2$ intermetallic layer 15 is now complete and the surface is ready for the next step in the fabrication process.

Figure 6:
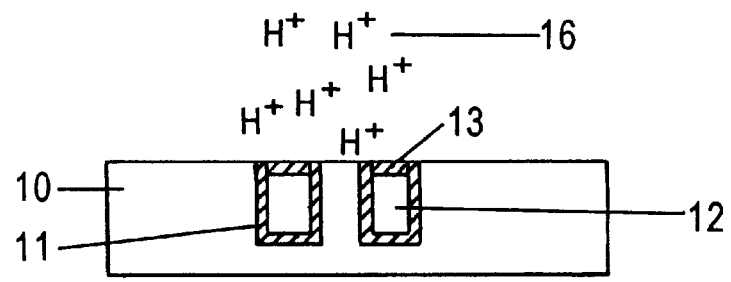

If the copper oxide layer 13 is too thick to be completely reduced during formation of the intermetallic layer as described above in connection with FIGS. 1–5, it is necessary to first reduce the copper oxide layer by exposure to a reducing agent prior to formation of the intermetallic layer. Referring now to FIG. 6, there is shown the substrate 10 with a copper oxide layer 13 that is thick, for example 50–200 Å. Prior to deposition of the Ti layer 14, the substrate 10 is exposed to hydrogen plasma 16 to reduce the copper oxide layer 13. The reducing agent can also be an ammonia plasma or silane, if desired. The reduction leaves an unoxidized Cu surface that is ready for deposition of the Ti layer 14 and the formation of the intermetallic $CuTi_2$ layer.

Figure 7:
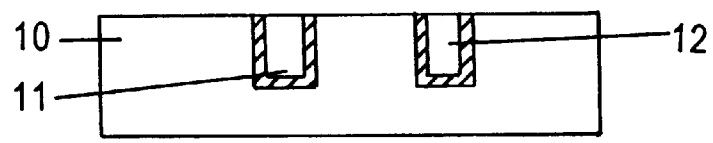

Referring now to FIG. 7, there is shown the surface of the resultant unoxidized Cu interconnect line 13. Following exposure to the hydrogen plasma 16, or other reducing agent, the intermetallic layer 15 is formed as previously described by depositing Ti, annealing, and etching.

Figure 8:
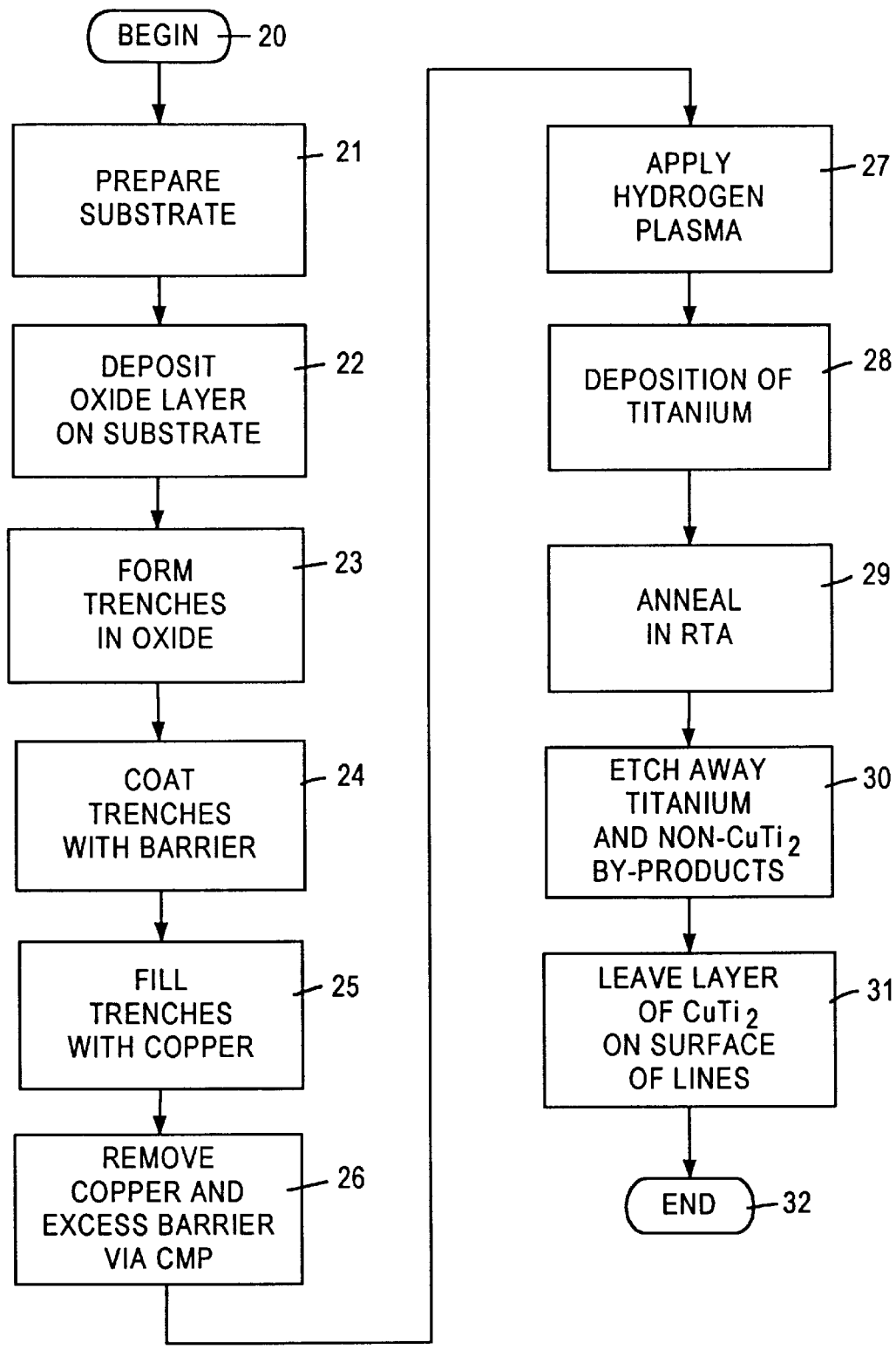

Referring now to FIG. 8, there is shown a flow chart illustrating the process steps of the invention disclosed in parent application Ser. No. 09/132,282. The process begins at a starting block 20 labelled "Begin." The first step 21 is to prepare the silicon substrate 10. An oxide layer is deposited on the substrate in step 22. The oxide layer is etched to produce damascene trenches in step 23. A layer of barrier material is deposited on the substrate coating the trenches in step 24. The trenches are then filled by deposition of a layer of Cu on the substrate in step 25. The excess barrier material and Cu are then removed by CMP in step 26. The substrate is then exposed to a reducing agent, such as hydrogen plasma, to reduce any copper oxide that has formed during CMP in step 27. A layer of Ti is then deposited on the substrate in step 28. The substrate is then annealed in an RTA to form the intermetallic layer by reaction of the Ti with the Cu surface in step 29. The unreacted Ti and by-products are then etched away using an etching solution selective to $CuTi_2$ in step 30. The result of the etching is the protective intermetallic layer on the surface of the interconnect line in step 31. The process is then complete and the substrate is ready for the next step in the production sequence at block 32 labelled "End."

The present invention constitutes a refinement of the invention disclosed in copending parent application Ser. No. 09/132,282, by employing a layer of Sn, Ta, Cr or alloy thereof in lieu of the Ti layer. Thus, the deposited sacrificial layer which is deposited on the Cu interconnect can comprise elemental Sn, Ta, or Cr, or an alloy of such elements.

In accordance with embodiments of the present invention, a sacrificial layer containing Sn, Ta and/or Cr, is deposited on the planarized surface of a Cu interconnect member. Heating is then conducted to diffuse Sn, Ta and/or Cr into the upper surface of the Cu interconnect member, thereby forming a passivating layer, e.g., an intermetallic alloy of Cu and Sn, Ta or Cr, at the upper surface of the Cu interconnect member.

Embodiments of the present invention comprise depositing a layer of Sn, Ta, Cr or an alloy thereof, at a thickness of about 100 Å to about 1,000 Å, e.g. about 500 Å, and heating to diffuse Sn, Ta and/or Cr into the upper surface of the Cu interconnect. The optimum heating conditions can be easily optimized for a particular situation. For example, in depositing a layer of Sn, Ta, Cr, or alloy thereof it was found suitable to heat at a temperature of about 200° C. to about 400° C., e.g. about 300° C., for about 1 minute to about 10 minutes, e.g. about 5 minutes, in an inert atmosphere, such as nitrogen or an inert gas, e.g. argon. The sacrificial alloying layer can typically contain about 0.1 at. % to about 99.9 at. % of Sn, Ta or Cr.

During heating or diffusion annealing, Sn, Ta and/or Cr atoms diffuse from the sacrificial layer into the upper surface of the Cu interconnect member to form a passivating layer which effectively prevents Cu diffusion from the Cu interconnect member. After diffusion annealing, a portion of the original sacrificial layer remains, e.g. about 50 Å to about 500 Å. The remaining sacrificial layer is removed after diffusion annealing, as by CMP or etch back.

Cu interconnect members formed in accordance with embodiments of the present invention can be, but are not limited to, interconnects formed by damascene technology. Thus, embodiments of the present invention include forming a dielectric interlayer overlying a substrate, forming an opening, e.g., a damascene opening, in the dielectric interlayer, depositing a diffusion barrier layer, such as Ta or TaN, and filling the opening with Cu. Advantageously, the opening in the dielectric interlayer can be filled by initially depositing a seed layer and then electroplating or electroless plating the Cu layer. The Cu layer can also be deposited by physical vapor deposition (PVD) or chemical vapor deposition (CVD). CMP is then performed such that the upper surface of the Cu layer is substantially coplanar with the upper surface of the dielectric interlayer. The sacrificial layer is then deposited and diffusion annealing is conducted.

In the various embodiments of the present invention, conventional substrates, dielectric interlayers and diffusion barrier layers can be employed. For example, the substrate can be doped monocrystalline silicon or gallium-arsenide. The dielectric interlayer employed in the present invention can comprise any dielectric material conventionally employed in the manufacture of semiconductor devices. For example, dielectric materials such as silicon dioxide, phospho-silicate-glass (PSG), boron doped PSG (BPSG), and silicon dioxide derived from tetraethylorthosilicate (TEOS) or silane by PECVD can be employed. Dielectric interlayers in accordance with the present invention can also comprise low dielectric constant materials, including polymers, such as polyimides and benzobydobutene (BCB). The openings formed in dielectric layers are effected by conventional photolithographic and etching techniques.

Figure 9:
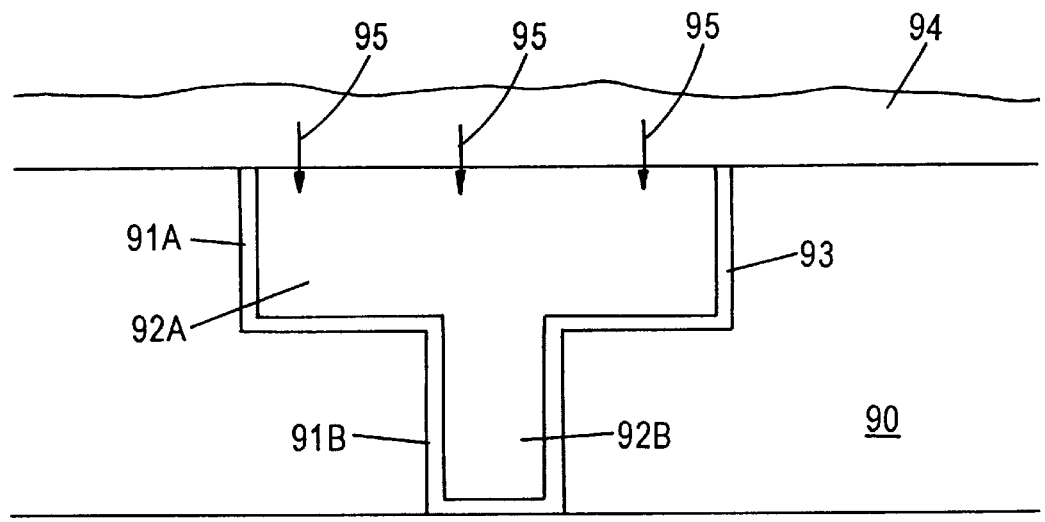
FIGS. 9 and 10 schematically illustrate sequential phases of a method in accordance with an embodiment of the present invention.
Figure 10:
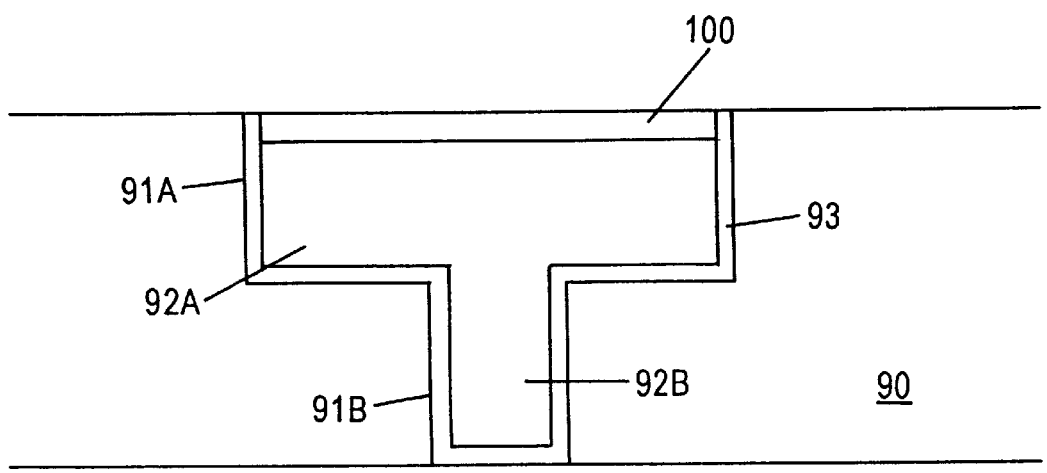

An embodiment of the present invention is schematically illustrated in FIGS. 9 and 10, wherein similar reference numerals denote similar features. Adverting to FIG. 9, a dual damascene opening comprising an upper trench 91A in communication with a lower via hole 91B is formed in dielectric layer 90. A barrier layer 93, such as Ta or TaN, is deposited lining the trench and on the dielectric layer 90. Cu is then deposited to fill the dual damascene opening forming a lower via 92B in electrical contact with metal line 92A. Chemical mechanical polishing is then conducted to form a planarized surface. Subsequently, a sacrificial layer of Sn, Ta, Cr or an alloy thereof 94 is deposited. Diffusion annealing is then conducted during which Sn, Ta and/or Cr, as indicated by arrows 95, diffuse from sacrificial layer 94 into the upper surface of the Cu metal line 92A. The diffusion of metal atoms into the upper surface of metal line 92A results in the formation of an electrically conductive passivating layer 100 in the upper surface of metal line 92A, e.g., an intermetallic alloy of Cu and Sn, Ta or Cr. Subsequently, any remaining sacrificial layer 94 (FIG. 9) is removed, as by CMP or etching.

The present invention provides efficient cost effective methodology for forming reliable passivated Cu interconnect members without any significant increase in the RC of the Cu interconnect member. The present invention advantageously overcomes the adhesion problem attendant upon conventional practices of forming a silicon nitride capping layer with its high dielectric constant. The present invention is applicable to the formation of various types of inlaid Cu metallization interconnection patterns. The present invention is particularly applicable in manufacturing semiconductor devices having submicron features and high aspect ratio openings.

In the previous description, numerous specific details are set forth, such as specific materials, structures, chemicals, processes, etc., to provide a better understanding of the present invention. However, the present invention can be practiced without resorting to the details specifically set forth. In other instances, well known processing and materials have not been described in detail in order not to unnecessarily obscure the present invention.

Only the preferred embodiment of the present invention and but a few examples of its versatility are shown and described in the present disclosure. It is to be understood that the present invention is capable of use in various other combinations and environments and is capable of changes or modifications within the scope of the inventive concept as expressed herein.

What is claimed is:

1. A method of manufacturing a semiconductor device, the method comprising sequentially:

forming a copper (Cu) layer;

chemical mechanical polishing an upper surface of the Cu layer;

forming a sacrificial layer, comprising tin (Sn), tantalum (Ta), chromium (Cr) or an alloy thereof, on the planarized surface of the Cu layer;

heating to diffuse Sn, Ta, and/or Cr into the upper surface of the Cu layer to form a passivating surface layer comprising Cu and Sn, Ta, and/or Cr leaving a remaining portion of the sacrificial layer; and removing the remaining portion of the sacrificial layer.

2. The method according to claim 1, further comprising removing the remaining portion of the sacrificial layer on the passivating surface layer after heating.

3. The method according to claim 2, comprising removing the remaining portion of the sacrificial layer by chemical mechanical polishing or etching.

4. The method according to claim 2, comprising:

depositing the sacrificial layer to a thickness of about 100 Å to about 1,000 Å; and heating to leave the remaining portion of the sacrificial layer having a thickness of about 50 Å to about 50 Å.

5. The method according to claim 1, comprising forming the Cu layer by:

depositing a seedlayer; and electroplating or electroless plating the Cu on the seedlayer.

6. The method according to claim 1, wherein:

the passivating surface layer comprises an intermetallic alloy of Cu and Sn, Ta or Cr.

7. The method according to claim 1, comprising heating to diffuse the Sn, Ta or Cr at a temperature of about 200° C. to about 400° C. for about 1 minute to about 10 minutes in an inert gaseous atmosphere.

8. The method according to claim 1, wherein the sacrificial layer consists essentially of Sn, Ta or Cr.

9. The method according to claim 8, wherein the sacrificial layer consists of Sn, Ta and Cr.

10. The method according to claim 1, comprising heating to diffuse the Sn, Ta or Cr at a temperature of about 200° C. to about 300° C.

11. The method according to claim 1, comprising:

forming a dielectric layer overlying a substrate;

forming an opening in the dielectric layer;

depositing the Cu layer in the opening and over the dielectric layer; and removing the remaining portion of the sacrificial layer beyond the opening by chemical mechanical polishing after heating to diffuse the Sn, Ta and/or Cr.

12. The method according to claim 11, comprising:

forming a barrier layer in the opening and;

depositing the Cu layer on the barrier layer.

13. The method according to claim 12, comprising:

depositing a seedlayer on the barrier layer, and electroplating or electroless plating the Cu layer on the seedlayer.

14. The method according to claim 1, further comprising forming a metal interconnection in direct electrical contact with the passivation surface layer.

15. A method of manufacturing a semiconductor device, the method comprising sequentially:

forming a copper (Cu) layer;

chemical mechanical polishing an upper surface of the Cu layer;

forming a sacrificial layer, comprising tin (Sn) or an alloy thereof, on the planarized surface of the Cu layer; and heating to diffuse Sn into the upper surface of the Cu layer to form a passivating surface layer comprising Cu and Sn.

16. The method according to claim 15, wherein:

the passivating surface layer comprises an intermetallic alloy of Cu and Sn.

17. The method according to claim 15, comprising heat treating at a temperature of about 200° C. to about 400° C. for about 1 minute to about 10 minutes in an inert gaseous environment.

18. The method according to claim 15, comprising removing any remaining sacrificial layer after heating by chemical mechanical polishing or etching.

19. The method according to claim 16, comprising:

depositing the sacrificial layer to a thickness of about 100 Å to about 1,000 Å; and heating to leave a remaining sacrificial layer of about 50 Å to about 500 Å.

20. The method according to claim 15, comprising:

forming a dielectric layer overlying a substrate;

forming an opening in the dielectric layer;

depositing the Cu layer in the opening and over the dielectric layer; and removing any portion of the sacrificial layer beyond the opening by chemical mechanical polishing after heating to diffuse the Sn.

21. The method according to claim 15, further comprising forming a metal interconnection in direct electrical contact with the passivation surface layer.

* * * * *

UNITED STATES PATENT AND TRADEMARK OFFICE
CERTIFICATE OF CORRECTION

PATENT NO. : 6,147,000
DATED : November 14, 2000
INVENTOR(S) : Lu You, et al.

It is certified that error appears in the above-identified patent and that said Letters Patent is hereby corrected as shown below:

Claims,
Column 8,
Claim 4 is incorrect. It should read as follows:

4. The method according to claim 2, comprising depositing the sacrificial layer to the thickness of about 100 Å to about 1,000 Å and heating to leave the remaining portion of the sacrificial layer having thickness of about 50 Å to about 500 Å.

Signed and Sealed this

Twenty-third Day of October, 2001

*Attest:*

NICHOLAS P. GODICI

*Attesting Officer*  *Acting Director of the United States Patent and Trademark Office*